(12) United States Patent
Yamashita et al.

(10) Patent No.: US 9,601,646 B2
(45) Date of Patent: Mar. 21, 2017

(54) SOLAR CELL MODULE (75) Inventors: Mitsuo Yamashita, Higashiomi (JP); Kouki Uchida, Ise (JP)

(73) Assignee: KYOCERA CORPORATION, Kyoto (JP)

( * ) Notice: Subject to any disclaimer, the term of this patent is extended or adjusted under 35 U.S.C. 154(b) by 1118 days.

(21) Appl. No.: 13/637,940

(22) PCT Filed: Apr. 21, 2011

(86) PCT No.: PCT/JP2011/059859
§ 371 (c)(1),
(2), (4) Date: Sep. 27, 2012

(87) PCT Pub. No.: WO2011/132748
PCT Pub. Date: Oct. 27, 2011

(65) Prior Publication Data
US 2013/0019923 A1    Jan. 24, 2013

(30) Foreign Application Priority Data

Apr. 21, 2010    (JP) ................................. 2010-097852

(51) Int. Cl.
*H02S 40/34* (2014.01)
*H01L 31/048* (2014.01)
*H01L 31/02* (2006.01)

(52) U.S. Cl.
CPC ...... *H01L 31/048* (2013.01); *H01L 31/02013* (2013.01); *H02S 40/34* (2014.12); *H02S 40/345* (2014.12); *Y02E 10/50* (2013.01)

(58) Field of Classification Search
None
See application file for complete search history.

(56) References Cited

U.S. PATENT DOCUMENTS 4,116,207 A * 9/1978 Dominguez .......... H01L 31/048
136/251
4,139,399 A * 2/1979 Lindmayer .......... H01L 31/048
136/251
(Continued)

FOREIGN PATENT DOCUMENTS

CN    1694267 A    11/2005
DE    102004036697 A1    2/2005
(Continued)

OTHER PUBLICATIONS

Machine translation of Brandner et al. (DE 10 2007 027 159 A1).*
(Continued)

*Primary Examiner* — Magali P Slawski
(74) *Attorney, Agent, or Firm* — Procopio Cory Hargreaves and Savitch LLP (57) ABSTRACT

A solar cell module having high reliability by increasing heat release of a bypass diode is provided. A solar cell panel including a photoelectric conversion unit, a holding member disposed at a periphery of the solar cell panel to hold the solar cell panel, a heat release plate spaced from the solar cell panel and disposed on the holding member, and a bypass diode attached to the heat release plate so as to be spaced from the solar cell panel and electrically connected to the photoelectric conversion unit are included. An attachment surface of the bypass diode to the heat release plate is disposed to face the holding member.

14 Claims, 9 Drawing Sheets

(56) References Cited

U.S. PATENT DOCUMENTS

| | | | | |
|---|---|---|---|---|
| 4,347,655 A * | 9/1982 | Zory | | H01L 31/0203 257/116 |
| 5,389,158 A * | 2/1995 | Fraas | | H01L 25/043 136/244 |
| 5,399,810 A * | 3/1995 | Hayami | | H01R 4/70 156/49 |
| 5,725,050 A * | 3/1998 | Meyer, IV | | F28D 15/0266 165/104.33 |
| 5,733,382 A * | 3/1998 | Hanoka | | B32B 17/10036 136/251 |
| 5,951,785 A | 9/1999 | Uchihashi et al. | | |
| 6,517,744 B1 * | 2/2003 | Hara | | B29C 70/025 148/108 |
| 2005/0197001 A1 * | 9/2005 | Higashikozono | | H01R 9/16 439/485 |
| 2006/0060874 A1 * | 3/2006 | Edmond | | H01L 33/007 257/98 |
| 2006/0235717 A1 * | 10/2006 | Sharma | | B32B 17/10018 438/57 |
| 2007/0054105 A1 * | 3/2007 | Hsiao | | H01L 23/3733 428/292.1 |
| 2007/0137689 A1 * | 6/2007 | Feldmeier | | H01R 9/2425 136/244 |
| 2008/0128017 A1 * | 6/2008 | Ford | | F24J 2/07 136/248 |
| 2008/0245765 A1 * | 10/2008 | Khaselev | | H01L 31/022425 216/13 |
| 2009/0084433 A1 * | 4/2009 | Takeda | | H01L 31/046 136/251 |
| 2009/0229809 A1 * | 9/2009 | Auman | | B32B 7/12 165/185 |
| 2010/0147362 A1 * | 6/2010 | King | | F24J 2/4614 136/251 |
| 2010/0163897 A1 * | 7/2010 | Hsiao | | H05K 1/0274 257/98 |
| 2010/0245009 A1 * | 9/2010 | Akiyama | | H01F 27/326 336/175 |
| 2011/0011641 A1 * | 1/2011 | Pfeffer | | H05K 7/20409 174/547 |

FOREIGN PATENT DOCUMENTS

| | | | |
|---|---|---|---|
| DE | 102007027159 A1 | | 9/2008 |
| JP | 05299545 A | * | 11/1993 |
| JP | H09-271179 A | | 10/1997 |
| JP | H11-354822 A | | 12/1999 |
| JP | 2005-057008 A | | 3/2005 |
| JP | 2005-251980 A | | 9/2005 |
| JP | 2006-013145 A | | 1/2006 |
| JP | 2006-059990 A | | 3/2006 |

OTHER PUBLICATIONS

The Engineering Toolbox "Thermal Conductivity of Materials and Gases" http://www.engineeringtoolbox.com/thermal-conductivity-d_429.html, accessed Oct. 27, 2015 3:12:58 PM.*

Machine translation of Sasaki et al. (JP 05-299545 A).*

American Heritage Dictionary "Surface" (2011) The Editors of the American Heritage Dictionaries,The American Heritage Dictionary of the English language. Boston, MA: Houghton Mifflin. http://search.credoreference.com/content/entry/hmdictenglang/surface/0.*

Office Action dated Oct. 8, 2014 issued in counterpart Chinese Application 201180014280.6.

The extended European search report dated Jan. 3, 2014 issued by European Patent Office for European Application No. EP11 77 2080.

International Preliminary Report on Patentability issued by the International Bureau of WIPO for the International Application No. PCT/JP2011/059859.

* cited by examiner

SOLAR CELL MODULE

TECHNICAL FIELD

The present invention relates to a solar cell module.

BACKGROUND ART

In a solar cell module, when dust or the like is deposited on light receiving surfaces of solar cell elements, a resistance within the solar cell elements increases and causes heat to be generated in some cases. The solar cell module comprises a bypass diode in order to reduce the heat generation. The bypass diode diverts a current flowing in the solar cell elements of which the resistance is increased.

However, when the bypass diode has a standard temperature or more under a high temperature environment, the bypass diode might not fulfill a bypass function or might not effectively reduce the heat generation of the solar cell elements.

In Japanese Patent Application Laid-Open No. 2006-13145, it is proposed that a heat release plate be disposed in a bottom portion of a terminal box provided on a lower portion of a solar cell panel and the bypass diode be disposed on the heat release plate in order to release the generated heat of the bypass diode toward the solar cell panel.

However, in the solar cell module of Japanese Patent Application Laid-Open No. 2006-13145, there have been cases in which the heat of the bypass diode is concentrated on a member such as a filler or a rear surface protection member adjacent to the bypass diode when the heat release plate to be laid on the bottom portion of the terminal box is small.

SUMMARY OF INVENTION

Problems to be Solved by the Invention

One object of the present invention is to provide a solar cell module in which reliability thereof is enhanced by increasing of heat release of the bypass diode.

Means for Solving the Problem

A solar cell module according to an embodiment of the present invention includes: a solar cell panel including a photoelectric conversion unit; a holding member configured to be disposed at a periphery of the solar cell panel and to hold the solar cell panel; a heat release plate configured to be spaced from the solar cell panel and to be disposed on the holding member; and a bypass diode configured to be attached to the heat release plate so as to be spaced from the solar cell panel and also to be electrically connected to the photoelectric conversion unit. An attachment surface of the bypass diode to the heat release plate is disposed to face the holding member.

According to the solar cell module of the embodiment of the present invention, the bypass diode is spaced from the solar cell panel and heat of the bypass diode is released to the holding member via the heat release plate spaced from the solar cell panel. Therefore, since the heat is effectively released outward via the holding member, the reliability under a high temperature environment can be enhanced.

BRIEF DESCRIPTION OF DRAWINGS

FIGS. 1A and 1B illustrate a solar cell module 1 according to a first embodiment of the present invention.

FIGS. 4A and 4B illustrate a terminal box 4 of the solar cell module 1 according to the first embodiment of the present invention.

FIG. 8 illustrates a heat release plate of a terminal box of a solar cell module 1D according to a fifth embodiment of the present invention.

EMBODIMENT FOR CARRYING OUT THE INVENTION

Hereinafter, a solar cell module according to embodiments of the present invention will be described with reference to the accompanying drawings.

<First embodiment>

A solar cell module 1 according to a first embodiment of the present invention will be described with reference to FIGS. 1A to 4B.

Figure 1A:
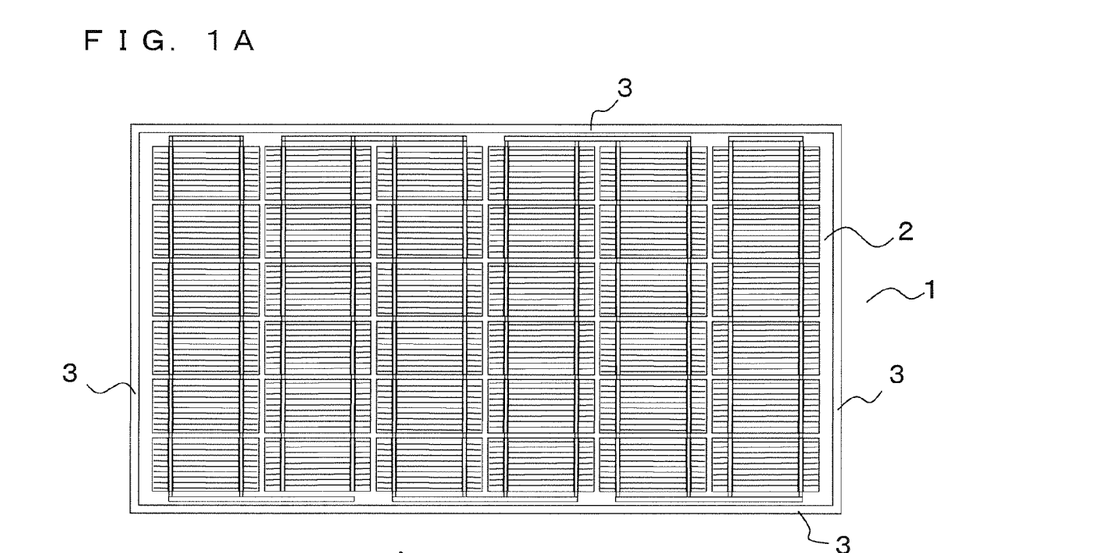
FIG. 1A is a plan view seen from a light receiving surface side.
Figure 1B:
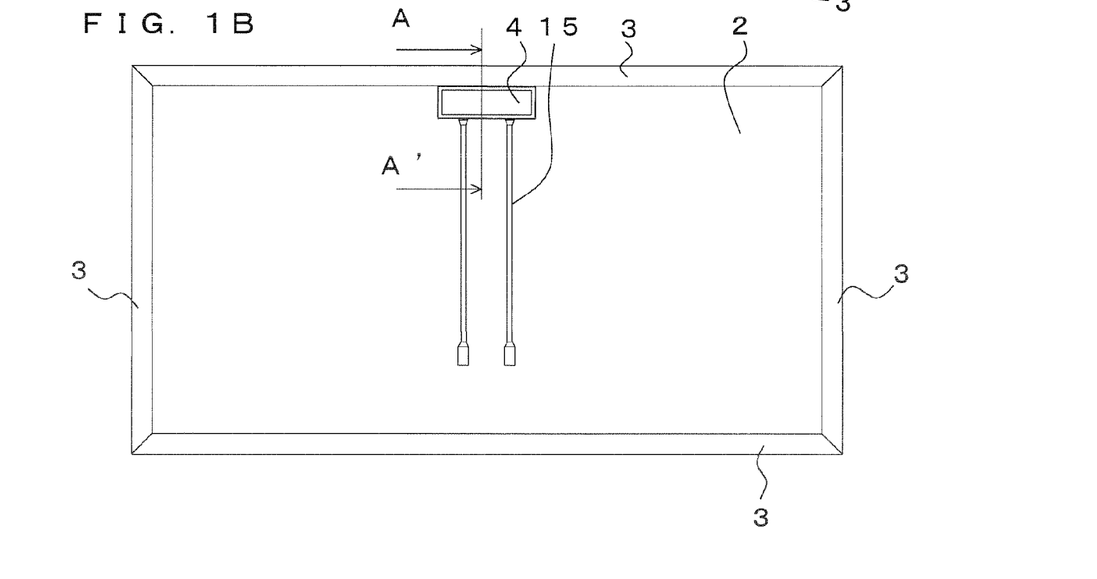
FIG. 1B is a plan view seen from a non-light receiving surface side.
Figure 2:
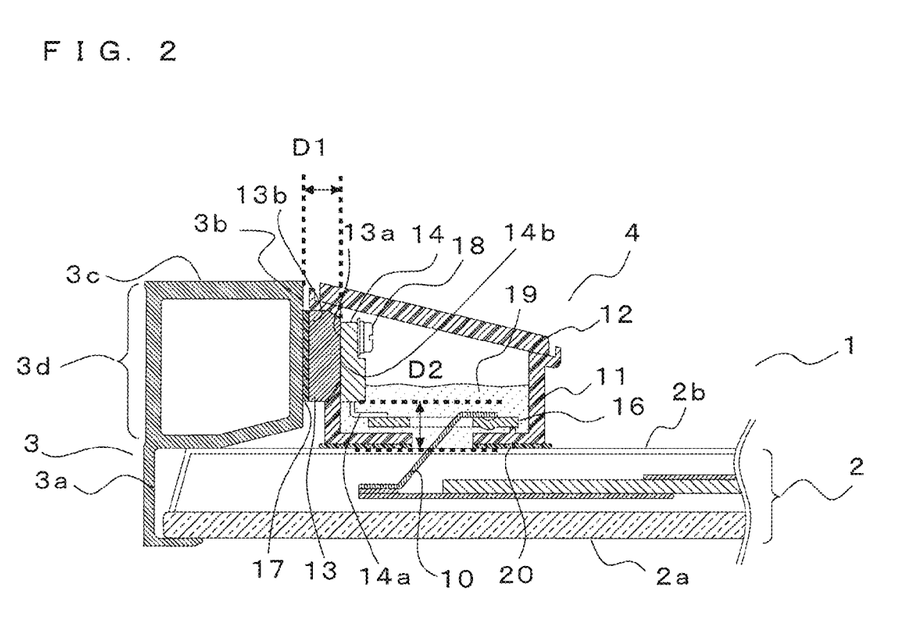
FIG. 2 is a cross-sectional view taken along line A-A' of FIG. 1B.

The solar cell module 1 according to the first embodiment of the present invention includes a solar cell panel 2, a holding member 3 holding a circumference of the solar cell panel 2, a terminal box 4 bonded to a rear surface of the solar cell panel 2, and a bypass diode 14 as shown in FIGS. 1A, 1B, and 2.

<Solar cell panel>

Figure 3:
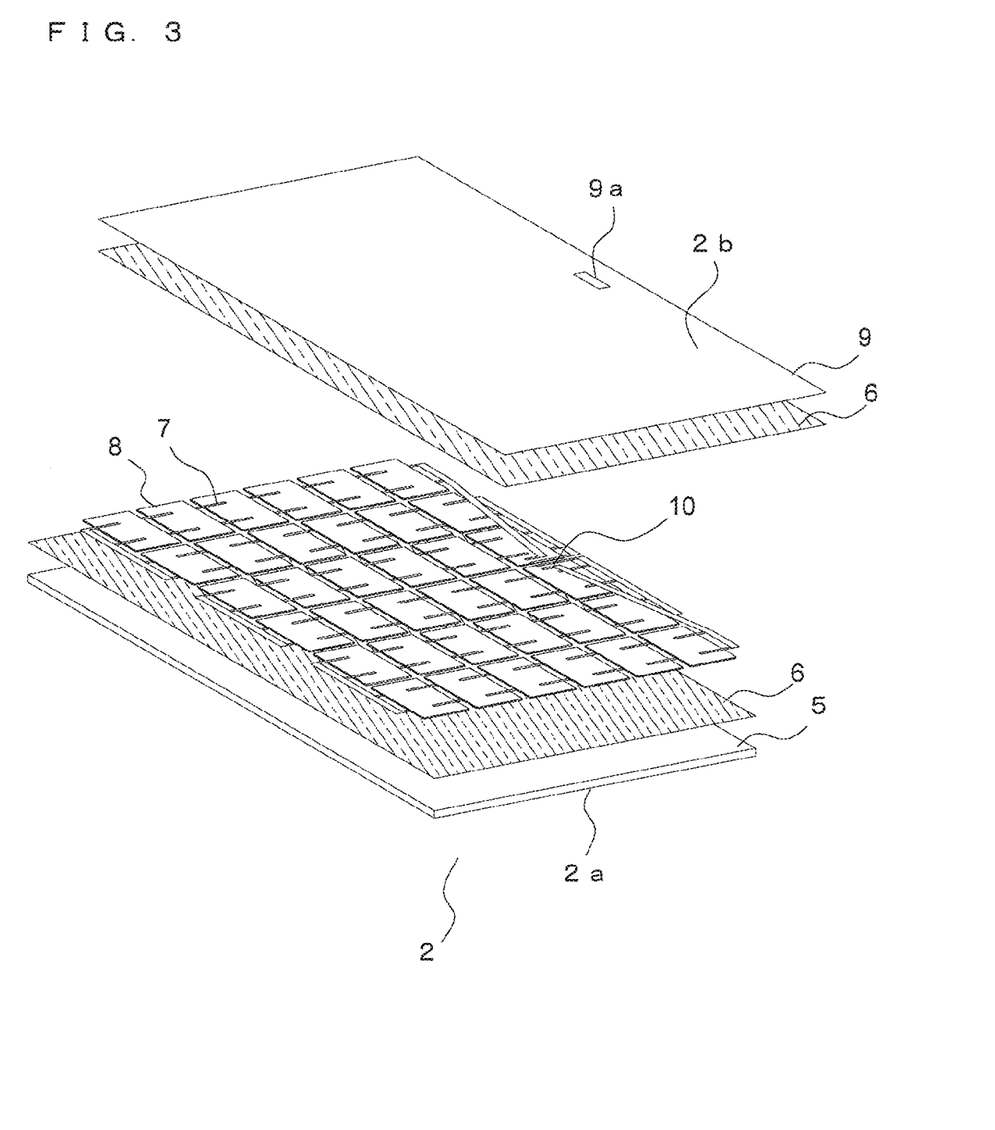
FIG. 3 is an exploded perspective view illustrating a laminated configuration of a solar cell panel 2 of the solar cell module 1 according to the first embodiment of the present invention.

As shown in FIG. 3, the solar cell panel 2 mainly includes a light receiving surface 2a (one main surface of a transparent substrate 5) that receives light, and a non-light receiving surface 2b (one main surface of a rear surface protection member 9) corresponding to a rear surface of the light receiving surface 2a. The solar cell panel 2 includes the transparent substrate 5, a pair of fillers 6 comprised of a thermosetting resin, and a plurality of solar cell elements 8 in this order from the light receiving surface 2a side. The transparent substrate 5 functions as a substrate of the solar cell module, and the fillers 6 protect a periphery of the plurality of solar cell elements 8. The plurality of solar cell elements 8 are electrically connected by inner leads 7. In addition, in the present embodiment, the solar cell element 8 corresponds to a photoelectric conversion unit.

Further, the solar cell panel 2 includes a rear surface protection member 9 protecting a rear surface of the solar cell module 1, and output leads 10 introduced from a hole 9a of the rear surface protection member 9 for taking outputs obtained in the solar cell elements 8 outward. In addition, the non-light receiving surface 2b is not limited to a configuration that does not receive light at all. For example, the non-light receiving surface 2b may include a configuration that receives a part of the light incident from the non-light receiving surface 2b side by causing the rear surface protection member 9 and the filler 6 positioned between the solar cell element 8 and the rear surface protection member 9 to be comprised of, for example, a material having a transmittance such as ethylene vinyl acetate (EVA).

As the solar cell element 8, for example, a member that has a flat plate shape and is comprised of single crystalline silicon, polycrystalline silicon or the like is used. When such silicon substrate is used, adjacent silicon substrates may be electrically connected to each other using the inner lead 7 as described above. The outputs obtained in the solar cell elements 8 are output via the output lead 10 passing through the hole 9a of the rear surface protection member 9.

In addition, in the solar cell element 8 corresponding to the photoelectric conversion unit, for example, a thin film solar cell comprised of amorphous silicon, a CIGS solar cell, a CdTe solar cell, a solar cell in which thin film amorphous silicon is formed on a crystalline silicon substrate, or the like may be used. For example, as the solar cells comprised of amorphous silicon, CIGS, and CdTe, a solar cell in which an amorphous silicon layer, a CIGS layer, or a CdTe layer is combined with a transparent electrode and appropriately stacked on a transparent substrate may be used. In addition, in the present embodiment, the polycrystalline silicon substrate is used as the solar cell element 8.

<Holding member>

The holding member 3 has a function of holding the solar cell panel 2. The holding member 3 is disposed at a periphery of the solar cell panel 2 and has a frame shape. As shown in FIG. 2, the holding member 3 includes a fitting unit 3a into which the solar cell panel 2 fits, and a fixing unit 3d connected to the fitting unit 3a and to which the bypass diode 14 is fixed via a heat release plate 13. The fixing unit 3d includes a bottom surface 3c, and an inner peripheral surface 3b facing an inner side of the solar cell panel 2. The inner peripheral surface 3b is positioned inside from an end of the solar cell panel 2 and is also disposed to face the bypass diode 14. In addition, the inner peripheral surface 3b is perpendicular to the main surface of the solar cell panel 2.

The holding member 3 may be comprised of a material having high thermal conductivity, for example, may be comprised of aluminum or iron. In this case, when the material of the holding member 3 is aluminum, extrusion or the like is used for the manufacture. On the other hand, when the material of the holding member 3 is iron, an iron plate may be roll-formed for the manufacture.

In addition, in the present embodiment, the holding member 3 includes a frame body holding all circumferences of the periphery of the solar cell panel 2. However, the shape of the holding member 3 is not limited thereto. For example, the holding member 3 may include a pair of bars holding at least parts of a pair of sides of the solar cell panel 2 as long as the holding member 3 can hold the solar cell panel 2.

<Terminal box>

Figure 4A:
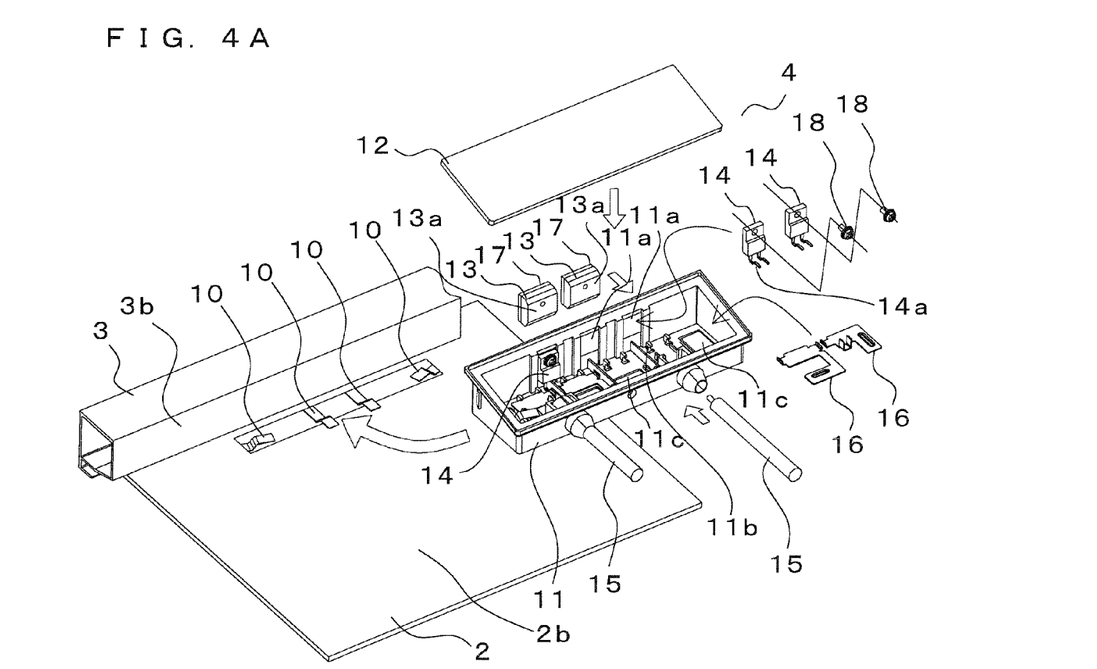
FIG. 4A is an exploded perspective view of the terminal box 4.
Figure 4B:
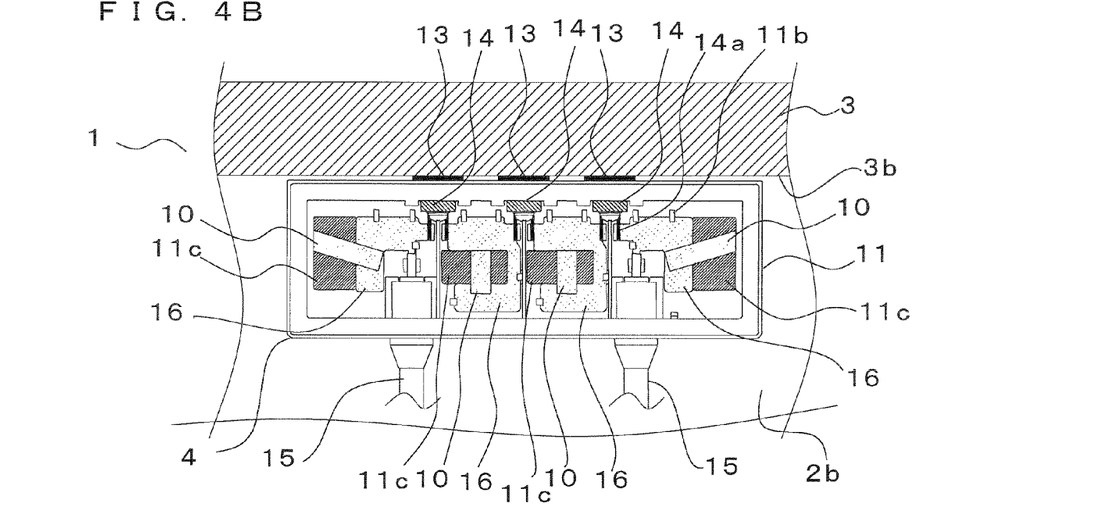
FIG. 4B is a plan view of the terminal box 4.

As shown in FIG. 4, the terminal box 4 includes a box-shaped housing 11 of which a top surface is opened, a cover 12 covering the opened top surface of the housing 11, and heat release plates 13 disposed in one side of the housing 11. The bypass diode 14 and a terminal 16 are stored within the terminal box 4. The bypass diode 14 is disposed in a first main surface 13a of the heat release plate 13 that will be described later within the terminal box 4. The terminal 16 electrically connects the output lead 10, the bypass diode 14, and an output cable 15.

The housing 11 internally stores the bypass diode 14, the output cable 15, the terminal 16, and so forth. In addition, a first through-hole 11a for causing the heat release plate 13 and the bypass diode 14 to be in contact with each other is provided on a side surface of the housing 11. A latching protrusion 11b latching the terminal 16 and a second through-hole 11c for leading the output lead 10 into the housing 11 are provided on a bottom surface of the housing 11.

Such housing 11 is comprised of, for example, a resin material having an insulating property. In particular, as a material of the housing 11, for example, a degenerated polyphenylene ether resin (degenerated PPE resin), a polyphenylene oxide resin (PPO resin), an ABS resin, or the like is included. In addition, in view of enhancing the light resistance against the ultraviolet light, the housing 11 may be comprised of a material in which a black pigment is mixed with such resin material, or an outer peripheral surface of the housing 11 may be made to be black.

In addition, a rear surface side of the housing 11 is fixed to a predetermined position of the non-light receiving surface side of the solar cell panel 2 using an adhesive 20 such as a silicone sealant. In addition, a size or a shape of the housing 11 may be appropriately determined depending on the size of the solar cell module 1 to be attached. In view of protecting the terminal box 4, the height of the housing 11 may be lower than the bottom surface 3c of the holding member 3 (bottom surface 3c of the fixing unit 3d).

The cover 12 closes and covers an opening on an upper surface of the housing 11. The cover 12 may be comprised of the same material as the housing 11. In addition, the cover 12 is fixed to the housing 11 by virtue of adhesion, fitting, fastening screws, and so forth.

The heat release plate 13 is a plate-shaped body disposed in a side surface of the housing 11. The heat release plate 13 is spaced from the solar cell panel 2, and is disposed on the holding member 3. As a material of the heat release plate 13, stainless steel, aluminum, or the like that is a metal material having durability against moisture and rain water over a long period and also having corrosion resistance and high thermal conductivity in view of more effective thermal conductivity to the holding member 3 is used.

The heat release plate 13 includes a first main surface 13a on which the bypass diode 14 is disposed, and a second main surface 13b fixed to the holding member 3. In addition, in the present embodiment, a portion corresponding to the rear surface of the first main surface 13a of the heat release plate 13 is the second main surface 13b. The first main surface 13a faces an inner side of the terminal box 4 and the second main surface 13b is exposed outward from the housing 11. In particular, the second main surface 13b is positioned outside the terminal box 4.

In addition, at least a part of the second main surface 13b of the heat release plate 13 may be in contact with and fixed to the holding member 3. However, when an entire surface of the second main surface 13b is configured to be in contact with the holding member 3, the heat release can be enhanced.

In addition, the thermal conductivity of the heat release plate 13 may be higher than the thermal conductivity of the housing 11. This enables an amount of heat transferred to the holding member 3 to be increased.

In addition, an adhesive such as a silicone sealant may be disposed to seal the housing 11 in a region other than the region to which the bypass diode 14 is attached in the first main surface 13a of the heat release plate 13. This causes a waterproof property of the terminal box 4 to be enhanced.

In the present embodiment, as shown in FIG. 2, the bypass diode 14 is spaced from the solar cell panel 2, and is disposed in a position corresponding to the holding member 3 with the heat release plate 13 interposed therebetween. In other words, in the present embodiment, the bypass diode 14 is disposed to be positioned right above the holding member 3 (the inner peripheral surface 3b of the holding member 3) via the heat release plate 13. In particular, the bypass diode 14 includes an attachment surface 14b that is attached to the heat release plate 13 and is also disposed to face the holding member 3 (the inner peripheral surface 3b of the holding member 3).

Here, in the heat transfer phenomenon, a thermal resistance R indicating the difficulty of heat flow is represented by R (thermal resistance)=L (distance)/λ (thermal conductivity)/A (area). Therefore, according to the present embodiment, since the distance between the bypass diode 14 and the holding member 3 can be made to be small to reduce the thermal resistance, the heat release can be enhanced. In addition, since the bypass diode 14 is disposed to be spaced from the solar cell panel 2 to be in non-contact with the solar cell panel 2, it is possible to reduce the heat of the bypass diode directly transferred to the solar cell panel 2. In addition, in the present embodiment in which the bypass diode 14 is spaced from the solar cell panel 2, it is possible to reduce the possibility of the bypass diode 14 falling out of the holding member 3 due to bending even when the bending occurs on the solar cell panel 2 due to an external load.

In addition, the heat release plate 13 may be disposed to effectively release (conduct) the heat to the holding member 3. In other words, the heat release plate 13 may be thermally and directly connected to the holding member 3 without being thermally and directly connected to the solar cell panel 2. That is, the heat release plate 13 may be in direct contact with the holding member 3. Meanwhile, in order to reduce a difference between the apparent contact area that is apt to occur due to a microscopic irregularity of the contact surface and a true area of contact, the heat release plate 13 may be disposed on the holding member 3 via a resin layer 17 that has an adhesion function and a small thickness. In addition, the heat release plate 13 may be adhesively-fixed to the holding member 3, or may be configured not to be fixed to the holding member 3. Here, the configuration of not fixing the heat release plate is the configuration in which the heat release plate 13 is only in contact with the holding member 3 but is not fixed by an adhesive. In addition, the resin layer 17 will be described later.

In addition, in the present embodiment, as shown in FIG. 2, the second main surface 13b of the heat release plate 13 is disposed to be exposed from the housing 11. According to this configuration, even when the heat release plate 13 is disposed within the terminal box 4, the second main surface 13b of the heat release plate 13 can be readily made to be in contact with the holding member 3, so that the process of installing the terminal box 4 is facilitated. In addition, exposure of the second main surface 13b from the housing 11 may be configured to cause the second main surface 13b and the outer peripheral surface of the housing 11 to be disposed on the same surface. In addition, as in the present embodiment, the thickness of the heat release plate 13 may be greater than the thickness of the housing 11. Accordingly, a thermal capacity of the heat release plate 13 becomes increased, and a function of causing the heat release plate 13 to serve as a buffer that alleviates a rapid temperature increase of the bypass diode 14 is enhanced. Further, in this case, the second main surface 13b is disposed to protrude from the housing 11, and attachment to the holding member 3 can thus be facilitated. In addition, in this case, the first main surface 13a is disposed on the same surface as an inner surface of the housing 11, and the terminal box 4 can thus be downsized.

In addition, in the present embodiment, the thickness of the heat release plate 13 is greater than the thickness of the holding member 3. According to this configuration, the thermal capacity of the heat release plate 13 is increased, and a function of causing the heat release plate 13 to serve as the buffer that alleviates the rapid temperature increase of the bypass diode 14 is enhanced.

In the present embodiment, not only the thermal conductivity of the heat release plate 13 but also the thermal conductivity of the holding member 3 may be increased. In this case, the holding member 3 and the heat release plate 13 can also have a high thermal diffusivity. The thermal diffusivity indicates a magnitude of a time-varying speed of a temperature distribution of an object, and the greater the value of the thermal diffusivity becomes, the faster the temperature changes. That is, the bypass diode 14 is cooled down in a short time when it is in contact with the member having a high thermal diffusivity. For this reason, the holding member 3 may be comprised of aluminum (thermal diffusivity: $83.6 \times 10^{-6}$ (m/s$^2$)) or iron (thermal diffusivity: 10 to $17.5 \times 10^{-6}$ (m/s$^2$)). In this case, the thermal diffusivity of the holding member 3 is higher than the thermal diffusivity of a PET resin (thermal diffusivity: $0.093 \times 10^{-6}$ (m/s$^2$)) constituting the rear surface protection member 9. This enables the heat of the bypass diode 14 to be moved and released in a broad area of the holding member 3 in a short time.

The bypass diode 14 is connected in a direction opposite to the diode polarity of the solar cell element 8, between the output leads 10 which are adjacent to each other. The shape of the bypass diode 14 may be, for example, a flat plate shape or a cylinder shape. In addition, the connection terminal 14a of the bypass diode 14 may be extended outside the bypass diode 14 so as to readily carry out connection between the bypass diode 14 and the output lead 10. A rated current or the like of the bypass diode 14 may be appropriately determined in consideration of the size or the number of series of the solar cell elements 8 of the solar cell module 1 to be used, and so forth. In addition, in the present embodiment, the bypass diode 14 is fixed to the first main surface 13a of the heat release plate 13 by a screw 18. A method of fixing the bypass diode 14 is not limited thereto, and may employ other fixing methods such as fitting.

Next, the mechanism in which the bypass diode 14 generates heat and the reason for which the heat release is necessary in the bypass diode 14 will be described.

For example, when light is irradiated on all solar cell elements 8 of the solar cell module 1, the current does not flow in the bypass diode 14. However, when a shadow is generated on any specific solar cell elements 8 to cause the electric power to be insufficiently generated, resistant components within the solar cell elements 8 are generated to make it difficult to flow the current, and the heat is also generated (a so-called hot spot is generated). In this case, since the potential difference of the solar cell elements 8 on which the shadow is generated becomes greater than the potential difference at both ends of the bypass diode 14, the current flows in the bypass diode 14. As a result, the bypass diode 14 reduces the current flowing in the solar cell elements 8 on which the shadow is generated, thereby reducing heat generation of the solar cell elements 8. Meanwhile, the bypass diode 14 generates heat to have an increased temperature due to the flowing current. Further, under a high temperature environment in which a further increase in temperature is expected, a defect that the current capacity is decreased is apt to occur in the bypass diode 14. Accordingly, the heat release of the bypass diode 14 becomes more important particularly under the high temperature environment.

In addition, in the present embodiment, the distance D1 from the bypass diode 14 to the holding member 3 is shorter than the distance D2 from the bypass diode 14 to the solar cell panel 2. This configuration enables the thermal resistance to be decreased.

In addition, here, the distance D1 is a shortest distance from the bypass diode 14 to the holding member 3. In the present embodiment, for example, as shown in FIG. 2, the distance is a shortest distance from the attachment surface 14*b* of the bypass diode 14 to the inner peripheral surface 3*b* of the holding member 3. In addition, here, the distance D2 is a shortest distance from the bypass diode 14 to the solar cell panel 2. In the present embodiment, for example, as shown in FIG. 2, the distance is a shortest distance from the lower surface (surface disposed to face the solar cell panel 2) of the bypass diode 14 to the non-light receiving surface 2*b* of the solar cell panel 2.

The terminal 16 acts to relay an electrical connection among the bypass diode 14, the output lead 10, and the output cable 15, and is comprised of a conductive metal plate, for example. A material of the terminal 16 may be, for example, a metal material having a low electrical resistance such as copper, phosphor bronze, brass, iron, and stainless steel.

The resin layer 17 is disposed between the heat release plate 13 and the holding member 3. In addition, the resin layer 17 acts as an adhesive for bonding the heat release plate 13 to the holding member 3, or acts as a buffer between the heat release plate 13 and the holding member 3. When the resin layer 17 is used to bond the heat release plate 13 to the holding member 3, a material that is in close contact to exhibit the thermal conductivity may be used for the resin layer 17.

When the resin layer 17 is used as the adhesive, for example, a silicon sealant, polyurethane, or the like is used as a resin material of the resin layer 17. When these materials are used, it is difficult for the physical property and the shape change with respect to the solar cell module 1 used outdoors during a long period. In addition, when an adhesive that becomes an elastic body after adhesion is used as the resin layer 17, the bonding can be maintained even when a load is applied to the solar cell module 1 or thermal expansion and contraction occur.

Further, for example, when a material in which metallic particles or ceramic particles having a high thermal conductivity are contained in a resin material is used as the resin layer 17, the thermal conductivity of the resin layer 17 can be enhanced. This causes the heat to be readily transferred to the holding member 3, thereby enhancing the heat release. As the metallic particles, for example, aluminum (thermal conductivity: 234 W/m·K), copper (thermal conductivity: 393 W/m·K), silver (thermal conductivity: 429 W/m·K), or an alloy of these metals is used. In addition, as the ceramic particles, for example, aluminum nitride (thermal conductivity: 200 W/m·K), alumina (thermal conductivity: 32 W/m·K), zirconia (thermal conductivity: 4 W/m·K), boron nitride (thermal conductivity: 36 W/m·K), or the like is used. When the ceramic particles are used, a good insulating property of the holding member 3 and the resin layer 17 can be ensured. The size of the metallic particles or the ceramic particles may be, for example, in a diameter range from 0.1 μm to 100 μm in view of enhancement of the thermal conductivity of the resin layer 17, and the resin formability and adhesion. In addition, the content rate of the metallic particles or the ceramic particles to the resin material may be 5% to 40% of the volume ratio with respect to the resin material in view of the enhancement of the thermal conductivity of the resin layer 17, and the resin formability and adhesion. In addition, when the resin layer 17 includes both of the metallic particles and the ceramic particles, the summed content rate of the metallic particles and the ceramic particles may be 5% to 40% of the volume ratio with respect to the resin material.

In addition, the resin layer 17 may be processed to have a sheet shape beforehand when it is used as the buffer. For example, the resin layer 17 comprises an adhesive layer which may be provided on both main surfaces of a base substrate formed by mixing a thermal conductivity filler with the binder of the synthetic resin or the rubber having elasticity after being cured and processing it to be a sheet shape. For example, silicone rubber, acrylic rubber, polyethylene rubber, fluorine rubber, or the like may be used as the binder of the base substrate, and graphite, mica, alumina, or the like may be used as the thermal conductivity filler. In addition, for example, silicone sealant or polyurethane may be used as the adhesive layer. When the resin layer 17 is disposed to be in close contact with each of the heat release plate 13 and the holding member 3 to increase the contact area between the heat release plate 13 and the holding member 3, the heat from the bypass diode 14 can be effectively transferred to the holding member 3. In addition, since the resin layer 17 having a buffering action is relatively apt to be elastically deformed, the deformation caused by the heat of the holding member 3 and the heat release plate 13 can be absorbed.

Further, in the present embodiment, as shown in FIG. 2, the housing 11 may be filled with a potting material 19 in view of reducing occurrence of mold, rust, or the like due to long-term use of the solar cell module 1 within the housing 11. In this case, it is preferable that the potting material 19 cover each of a portion electrically connecting the terminal 16 and the output lead 10, a portion electrically connecting the terminal 16 and the bypass diode 14, and a portion electrically connecting the terminal 16 and the output cable 15. As the potting material 19, an epoxy resin having a small change in physical property over time after being cured may be suitably used.

As described above, in the present embodiment, the bypass diode 14 is disposed to be spaced from the solar cell panel 2, and the heat of the bypass diode 14 is released to the holding member 3 via the heat release plate 13. Accordingly, the heat can be effectively released outside via the holding member 3 and an influence of the heat on the rear surface protection member 9 or the filler 6 of the solar cell panel 2 can be alleviated. As a result, in the present embodiment, the reliability under the high temperature environment can be enhanced.

<Second embodiment>

A solar cell module 1A according to a second embodiment of the present invention will be described with reference to FIG. 5. The solar cell module 1A is different from the solar cell module 1 according to the first embodiment in the configuration between the bypass diode 14 and the holding member 3. In particular, the solar cell module 1A according to the second embodiment includes a configuration in which double insulation is made between an electric conduction unit of the bypass diode 14 and the holding member 3.

Here, the double insulation is insulation comprised of basic insulation and supplementary insulation. In addition, the basic insulation is insulation that gives basic protection against electrical shock, and the supplementary insulation is insulation that is independently provided in addition to the basic insulation in order to give protection against the electrical shock when the basic insulation is broken.

In addition, the bypass diode 14 of the present embodiment is a package diode in which the electrical conduction unit is covered with the epoxy resin.

Figure 5:
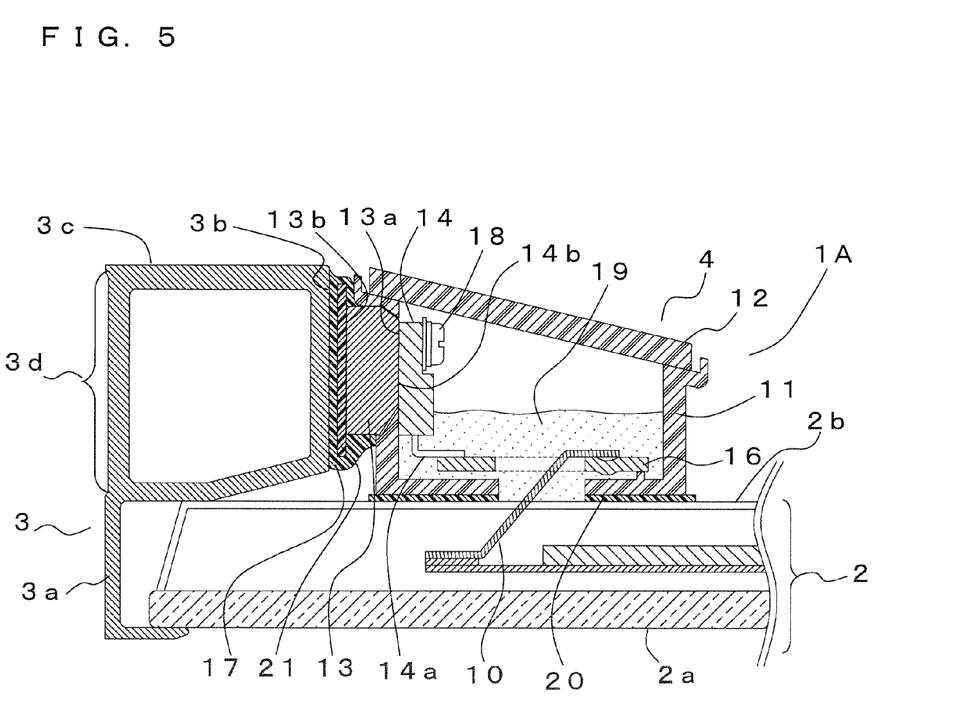
FIG. 5 illustrates a terminal box of a solar cell module 1A according to a second embodiment of the present invention, and is a cross-sectional view illustrating a cross-section corresponding to the position of FIG. 2.

As shown in FIG. 5, the solar cell module 1A according to the second embodiment further includes an insulating layer 21 disposed between the second main surface 13b of the heat release plate 13 and the resin layer 17 in comparison with the solar cell module 1 according to the first embodiment. A main surface of the insulating layer 21 disposed to face the second main surface 13b of the heat release plate 13 is larger than the second main surface 13b of the heat release plate 13. A portion exposed to the outside of the housing 11 in the heat release plate 13 and the insulating layer 21 is covered with the resin layer 17.

Here, the insulating layer 21 may have an insulating property, and the insulating layer in which, for example, a binder and a thermal conductivity filler are mixed and processed to be a sheet shape may be used. Here, an insulating rubber such as silicone rubber, acrylic rubber, polyethylene rubber, and fluorine rubber or a synthetic resin may be used as the binder, and a thermal conductivity filler with which an insulating material such as boron nitride (BN), aluminum nitride (AlN), or alumina ($Al_2O_3$) is mixed may be used as the thermal conductivity filler. In addition, in view of increasing the creeping distance between the heat release plate 13 and the holding member 3 to prevent tracking, the periphery of the main surface of the insulating layer 21 may be greater than the periphery of the second main surface 13b of the heat release plate 13 by about 1 to 4 mm.

By including the insulating layer 21, the electrical conduction through the pinhole between the heat release plate 13 and the holding member 3 when the heat release plate 13 and the holding member 3 are directly adhered to each other by the adhesive can be prevented, thereby successfully maintaining the insulation.

Further, in the present embodiment, the insulation is made by covering the insulating layer 21 and the heat release plate 13 which are exposed to the outside of the housing 11 with the resin layer 17. The silicone sealant or the like may be used as the resin layer 17.

As described above, in the present embodiment, the first insulator is an epoxy resin covering the circumference of the electrical conduction unit of the bypass diode 14 and the second insulator is the insulating layer 21 and the resin layer 17 in the double insulation.

Such configuration enables the double insulation to be made between the terminal box 4 and the holding member 3 and enables the heat release and the reliability to be enhanced.

<Third Embodiment>

Figure 6:
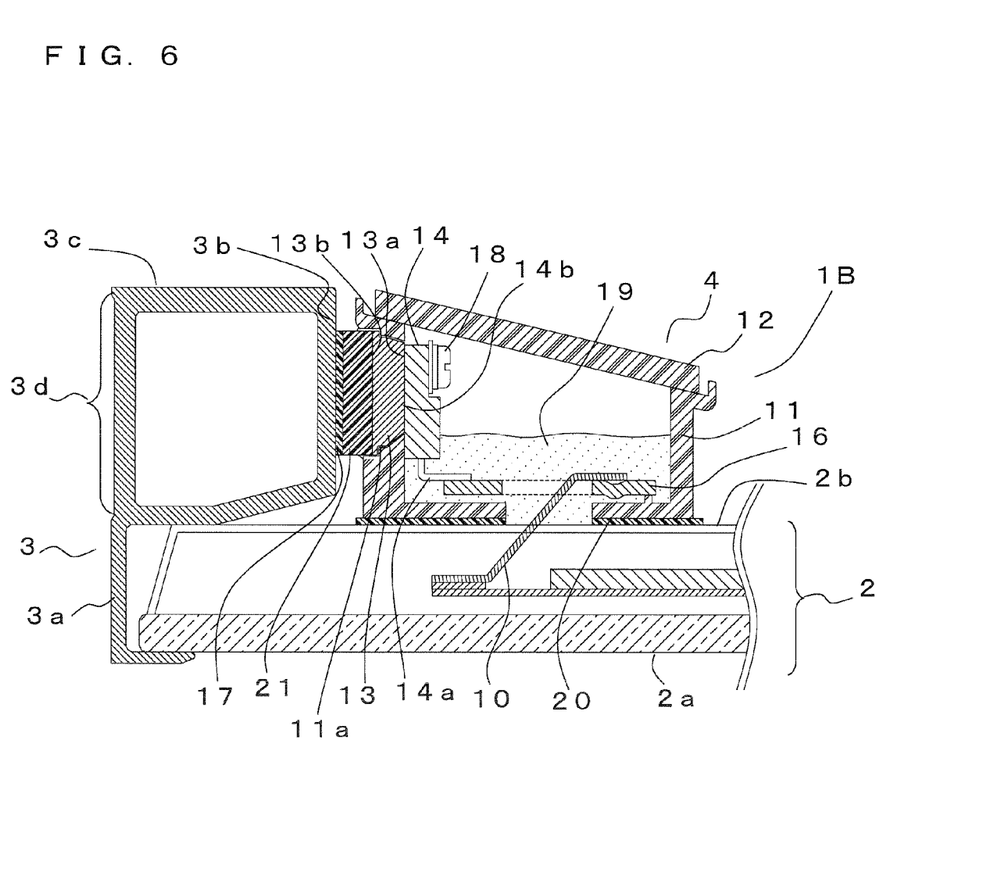
FIG. 6 illustrates a terminal box of a solar cell module 1B according to a third embodiment of the present invention, and is a cross-sectional view illustrating a cross-section corresponding to the position of FIG. 2.

A solar cell module 1B according to a third embodiment of the present invention will be described with reference to FIG. 6. The solar cell module 1B is different from the solar cell module 1A according to the second embodiment in the contact configuration of the insulating layer 21 and the heat release plate 13. In particular, in the solar cell module 1B according to the third embodiment, the insulating layer 21 is in contact with the heat release plate 13 at an inner side of the first through-hole 11a of the housing 11.

As in the second embodiment, the insulating layer 21 may have an insulating property, for example, may have a sufficient elasticity to be easily deformed and return to the original shape. In addition, as the insulating layer 21, for example, a material in which the binder and the thermal conductivity filler are mixed and processed to be a sheet shape may be used. In this case, an insulating rubber such as silicone rubber, acrylic rubber, polyethylene rubber, and fluorine rubber, or a synthetic resin may be used as the binder, and a material with which a material having an insulating property such as alumina is mixed may be used as the thermal conductivity filler.

Since the insulating layer 21 is in contact with the heat release plate 13 at an inside of the first through-hole 11a, it is difficult for the heat release plate 13 to be in contact with moisture outside the terminal box 4, and the insulating property can thus be enhanced to perform double insulation. In addition, since the thickness of the insulating layer 21 can be made to be greater, the thermal contact between the terminal box 4 and the holding member 3 can be maintained in response to the bending of the holding member 3 occurring when the load is applied to the solar cell module 1B.

<Fourth Embodiment>

Figure 7:
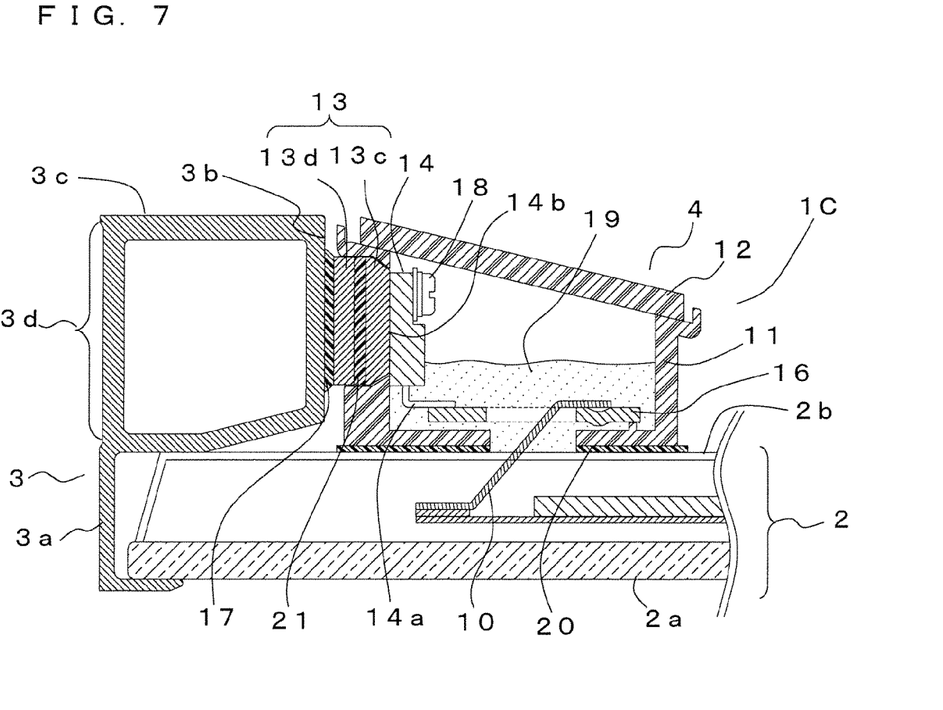
FIG. 7 illustrates a terminal box of a solar cell module 1C according to a fourth embodiment of the present invention, and is a cross-sectional view illustrating a cross-section corresponding to the position of FIG. 2.

A solar cell module 1C according to a fourth embodiment will be described with reference to FIG. 7. The solar cell module 1C is different from the solar cell module 1 according to the first embodiment in the disposed configuration of the insulating layer 21. In particular, in the solar cell module 1C according to the fourth embodiment, the insulating layer 21 is interposed between a first heat release plate 13c and a second heat release plate 13d at an inner side of the first through-hole 11a in order to perform the double insulation.

That is, the heat release plate 13 includes the first heat release plate 13c disposed on the bypass diode 14 side and the second heat release plate 13d disposed on the holding member 3 side. The insulating layer 21 is disposed within the first through-hole 11a and is also disposed between the first heat release plate 13c and the second heat release plate 13d. In addition, as shown in FIG. 7, the thickness of the insulating layer 21 is less than the thickness of the housing 11.

As in the first embodiment, stainless steel or aluminum may be used for the first heat release plate 13c and the second heat release plate 13d. In addition, as in the second embodiment, a material in which the binder and the thermal conductivity filler are mixed and processed to be a sheet shape may be used for the insulating layer 21. In this case, an insulating rubber such as silicone rubber, acrylic rubber, polyethylene rubber, and fluorine rubber or a synthetic resin may be used as the binder, and a material with which a material having an insulating property such as alumina is mixed may be used as the thermal conductivity filler. Since the insulating layer 21 is interposed between the first heat release plate 13c and the second heat release plate 13d at an inner side of the first through-hole 11a, deterioration of the insulating layer 21 can be reduced, and the reliability of the double insulation can be enhanced.

<Fifth embodiment>

A solar cell module 1D according to a fifth embodiment of the present invention will be described with reference to FIGS. 8A and 8B. The solar cell module 1D is different from the solar cell module 1 according to the first embodiment in the configuration of the heat release plate 13. In particular, in the solar cell module 1D according to the fifth embodiment, a composite material having a high insulating property is used as the heat release plate 13.

The heat release plate 13 is, for example, a composite material in which a base material of the resin is reinforced with a reinforcement material having an insulating property and a high thermal conductivity. By using the heat release plate 13, both of the cooling performance and the double insulation can be combined.

Figure 8A:
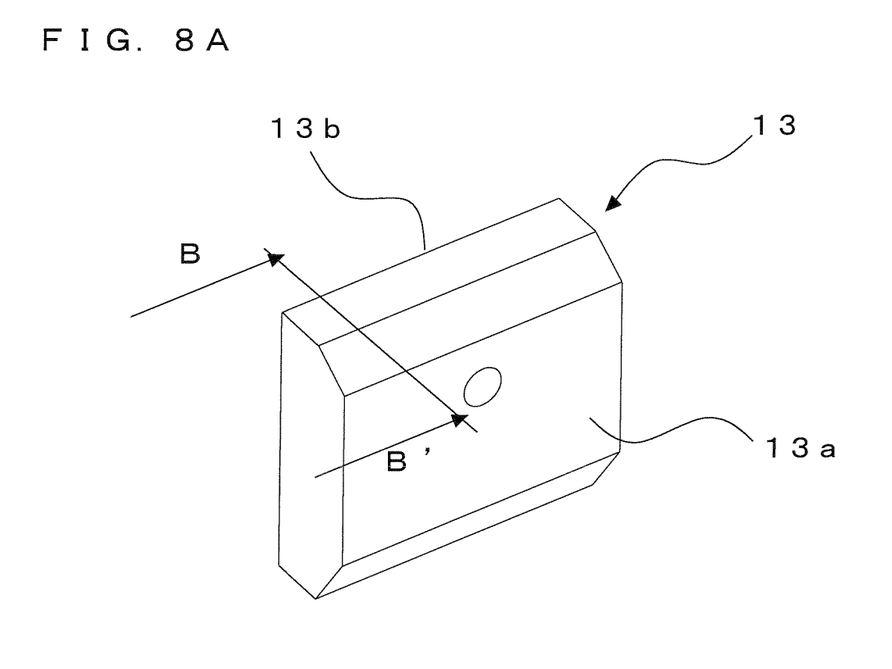
FIG. 8A is a perspective view.
Figure 8B:
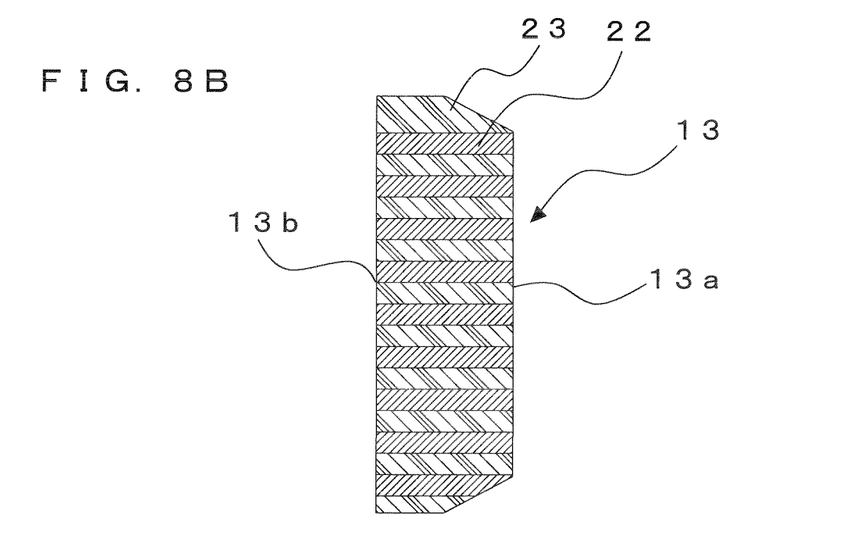
FIG. 8B is a cross-sectional view illustrating cross-section B-B' of FIG. 8A.

In the present embodiment, as shown in FIG. 8, continuous fibers 22 arranged in a direction toward the second main surface 13b from the first main surface 13a are used as the reinforcement material in order to increase the thermal conductivity of the heat release plate 13. In this case, a silicone resin, an epoxy resin, or a polyphenylene sulfide (PPS) may be used as a base material 23, and boron nitride (BN), aluminum nitride (AlN), or alumina ($Al_2O_3$) may be used as the continuous fibers 22. In addition, a material having a higher thermal conductivity than the housing 11 may be used as the continuous fiber 22.

As in the present embodiment, since the continuous fibers 22 having a higher thermal conductivity are continuously connected between the first main surface 13a and the second main surface 13b, the thermal resistance between the holding member 3 and the bypass diode 14 can be reduced to connect them by a high heat flux. Therefore, the thermal conductivity can be effectively enhanced by causing the continuous fibers 22 to connect between the first main surface 13a and the second main surface 13b. In addition, since the heat release plate 13 of the present embodiment is a composite material in which both of the base material and the reinforcement material are an insulating material, the double insulation between the holding member 3 and the bypass diode 14 can also be realized. By using the composite material for the heat release plate 13, the thermal conductivity of 1 to 10 [W/m·K] can be obtained.

In addition, in the present embodiment, although the heat release plate 13 using the continuous fiber as the reinforcement material is illustrated, the structure of the heat release plate 13 is not limited thereto. For example, a short fiber may be used as the reinforcement material. In this case, the polyphenylene sulfide (PPS) or the epoxy resin may be used as the base material of the resin of the heat release plate 13, and the filler of boron nitride (BN), aluminum nitride (AlN), and alumina ($Al_2O_3$) may be used as the reinforcement material. In this case, a filling factor of the filler in the base material may be, for example, 40% to 60% by volume. In addition, the heat release plate 13 using the composite material enables the thermal conductivity of 1 to 3 [W/m·K] to be obtained.

<Sixth embodiment>

Figure 9:
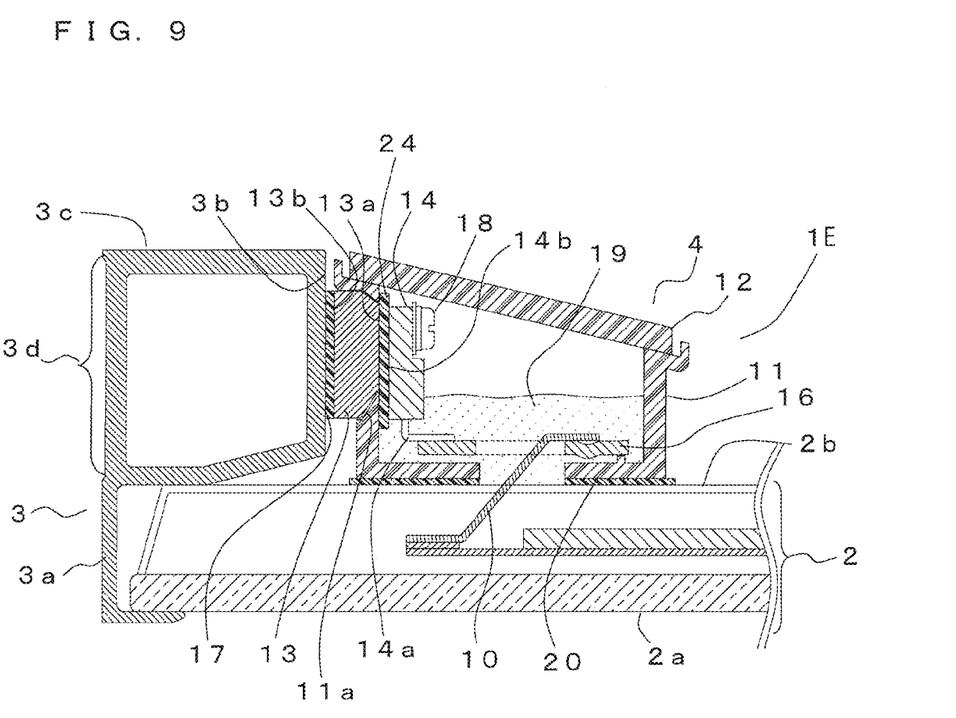
FIG. 9 illustrates a terminal box of a solar cell module 1E according to a sixth embodiment of the present invention, and is a cross-sectional view illustrating a cross-section corresponding to the position of FIG. 2.

A solar cell module 1E according to a sixth embodiment of the present invention will be described with reference to FIG. 9. The solar cell module 1E is different from the solar cell module 1 according to the first embodiment in the configuration between the bypass diode 14 and the holding member 3. In particular, in the solar cell module 1E according to the sixth embodiment, as shown in FIG. 9, an insulating tape 24 is disposed between the heat release plate 13 and the bypass diode 14. Further, a material of the screw 18 fixing the bypass diode 14 may be a resin.

In the present embodiment, the first main surface 13a of the heat release plate 13 and an inner surface of the housing 11 are on the same plane. As shown in FIG. 9, the insulating tape 24 is disposed to cover the first main surface 13a of the heat release plate 13 and an inner surface near the first through-hole 1 la of the housing 11 positioned nearby the first main surface 13a. This configuration enhances the insulating property.

A material of the screw 18 may be appropriately selected from, for example, materials having an insulating property, a heat resistance property, and a weather resistance such as polycarbonate, polyphenylene sulfide, or polypropylene. A composite material having a higher thermal conductivity may be used.

In addition, the insulating tape 24 includes a base material and an adhesive material, epoxy, polyester, polytetrafluoroethylene (PTFE), polyimide, or glass cloth may be used as the base material, and thermosetting rubber, thermosetting silicone, or acrylic or non-heating type rubber may be used as the adhesive material. In addition, the thickness of the insulating tape 24 may be 0.02 mm to 0.3 mm.

In the present embodiment, since the insulation can be made using the thin insulating tape 24, the thermal resistance can be reduced to maintain the heat flux toward the heat release plate 13 from the bypass diode 14 and the double insulation can be made. In addition, downsizing of the terminal box 4 can be promoted.

<Seventh embodiment>

A solar cell module 1F according to a seventh embodiment of the present invention will be described. The solar cell module 1F is different from the solar cell module 1 according to the first embodiment in the material of the heat release plate 13. In particular, in the solar cell module 1F according to the seventh embodiment, a material of the heat release plate 13 is a material having an insulating property. In particular, the material of the heat release plate 13 is aluminum nitride. As the material having the insulating property used as the material of the heat release plate 13, aside from aluminum nitride, silicon carbide or the like may also be used.

In such configuration, since the heat release plate 13 has the insulating property and the high thermal conductivity, the bypass diode 14 can be cooled down and the double insulation can be appropriately realized.

In addition, as the solar cell module to which the present invention can be applied, the solar cell module is not limited to super-straight structures described in the first embodiment to the sixth embodiment, and this invention may be applied to the solar cell modules including various structures such as a glass package structure or a substrate structure.

REFERENCE NUMERALS 1, 1A, 1B, 1C, 1D, 1E: Solar cell module
2: Solar cell panel
2a: Light receiving surface
2b: Non-light receiving surface
3: Holding member
3a: Fitting unit
3b: Inner peripheral surface
3c: Bottom surface
3d: Fixing unit
4: Terminal box
5: Transparent substrate
6: Filler
7: Inner lead
8: Solar cell element 9: Rear surface protection member
9a: Hole
10: Output lead
11: Housing
11a: First through-hole
11b: Latching protrusion
11c: Second through-hole
12: Cover
13: Heat release plate
13a: First main surface
13b: Second main surface
13c: First heat release plate
13d: second heat release plate
14: Bypass diode
14a: Connection terminal
14b: Attachment surface
15: Output cable
16: Terminal
17: Resin layer
18: Screw
19: Potting material
20: Adhesive
21: Insulating layer
22: Continuous fiber
23: Base material
24: Insulating tape

The invention claimed is:

1. A solar cell module comprising:
a solar cell panel including a photoelectric conversion unit;
a holding member disposed at a periphery of the solar cell panel to hold the solar cell panel;
a heat release plate spaced from the solar cell panel and disposed on the holding member;
a bypass diode attached to the heat release plate so as to be spaced from the solar cell panel and electrically connected to the photoelectric conversion unit;
a housing storing the bypass diode and including a first through-hole in which the heat release plate is disposed; and
a resin layer disposed to cover a portion of the heat release plate positioned outside the housing,
wherein the heat release plate includes a first main surface on which the bypass diode is attached, and a second main surface that is opposite the first main surface, exposed from the housing, and fixed to the holding member.

2. The solar cell module according to claim 1, wherein the holding member comprises a fitting unit into which the solar cell panel fits, and a fixing unit connected to the fitting unit and to which the bypass diode is fixed, and the fixing unit comprises an inner peripheral surface positioned inside from an end of the solar cell panel and disposed to face the bypass diode.

3. The solar cell module according to claim 1, wherein an entire surface of the second main surface of the heat release plate is in contact with an inner peripheral surface of the holding member.

4. The solar cell module according to claim 1, wherein a thermal conductivity of the heat release plate is greater than a thermal conductivity of the housing.

5. The solar cell module according to claim 1, further comprising:
a resin layer disposed between the heat release plate and the holding member,
wherein the resin layer comprises a resin material and at least any one of metallic particles and ceramic particles.

6. The solar cell module according to claim 1, wherein a thickness of the heat release plate is greater than a thickness of the housing.

7. The solar cell module according to claim 1, wherein a distance D1 from the bypass diode to the holding member is smaller than a distance D2 from the bypass diode to the solar cell panel.

8. The solar cell module according to claim 1, further comprising:
an insulating layer disposed between the heat release plate and the holding member.

9. The solar cell module according to claim 1, wherein the heat release plate comprises a resin material and a conductive filler that contains one or more of boron nitride, aluminum nitride, and alumina.

10. The solar cell module according to claim 9, wherein the heat conductive filler further comprises one or more fibers connecting the first main surface and the second main surface of the heat release plate.

11. The solar cell module according to claim 1, further comprising:
an insulating tape disposed between the bypass diode and the heat release plate.

12. The solar cell module according to claim 1, wherein the heat release plate is disposed from an inside the first through-hole to an outside of the first through-hole that is outside the housing, such that the second main surface is positioned outside the housing.

13. A solar cell module comprising:
a solar cell panel including a photoelectric conversion unit;
a holding member disposed at a periphery of the solar cell panel to hold the solar cell panel;
a heat release plate spaced from the solar cell panel and disposed on the holding member;
a bypass diode attached to the heat release plate so as to be spaced from the solar cell panel and electrically connected to the photoelectric conversion unit;
a housing storing the bypass diode and including a first through-hole in which the heat release plate is disposed, and a rear surface side of the housing being fixed to a predetermined position of a non-light receiving surface side of the solar cell panel using an adhesive; and
a resin layer disposed to cover a portion of the heat release plate positioned outside the housing,
wherein the heat release plate includes a first main surface, on which the bypass diode is attached, and a second main surface that is opposite the first main surface, exposed from the housing, and fixed to the holding member.

14. A solar cell module comprising:
a solar cell panel including a photoelectric conversion unit;
a holding member disposed at a periphery of the solar cell panel to hold the solar cell panel;
a heat release plate spaced from the solar cell panel and disposed on the holding member;
a bypass diode attached to the heat release plate so as to be spaced from the solar cell panel and electrically connected to the photoelectric conversion unit;
a housing storing the bypass diode and including a first through-hole in which the heat release plate is disposed;
an insulating layer disposed between the heat release plate and the holding member; and a resin layer disposed to cover a portion of the heat release plate positioned outside the housing and the insulating layer;

wherein the heat release plate includes a first main surface, on which the bypass diode is attached, and a second main surface that is opposite the first main surface, exposed from the housing, and fixed to the holding member.

\* \* \* \* \*